United States Patent [19]
Tamanuki et al.

[11] Patent Number: 5,835,261
[45] Date of Patent: Nov. 10, 1998

[54] SEMICONDUCTOR OPTICAL AMPLIFIER DEVICE CAPABLE OF DEFLECTING OUTPUT LASER BEAM

[75] Inventors: Takemasa Tamanuki; Tatsuya Sasaki; Mitsuhiro Kitamura, all of Tokyo, Japan

[73] Assignee: NEC Corporation, Tokyo, Japan

[21] Appl. No.: 579,162

[22] Filed: Dec. 27, 1995

[30] Foreign Application Priority Data

Dec. 28, 1994 [JP] Japan .................................. 6-329138

[51] Int. Cl.⁶ .................................................. H01S 3/00
[52] U.S. Cl. .................................................. 359/344
[58] Field of Search .................................. 359/344, 315, 359/316; 385/14; 372/43, 50

[56] References Cited

U.S. PATENT DOCUMENTS

| | | | |
|---|---|---|---|
| 5,122,894 | 6/1992 | Grantham | 359/245 |
| 5,175,643 | 12/1992 | Andrews | 359/339 |
| 5,233,673 | 8/1993 | Vali et al. | 385/3 |
| 5,355,237 | 10/1994 | Lang et al. | 359/130 |
| 5,394,489 | 2/1995 | Koch | 385/14 |
| 5,457,569 | 10/1995 | Liou et al. | 359/344 |
| 5,539,571 | 7/1996 | Welch et al. | 359/344 |

FOREIGN PATENT DOCUMENTS 2-39773  9/1990  Japan .

OTHER PUBLICATIONS

"Band–Edge Electroabsorption in Quantum Well Structures: The Quantum–Confined Stark Effect," D. A. B. Miller et al., Physical Review Letters, vol. 53, No. 22, Nov. 26, 1984, pp. 2173–2176.

"Beam Scanning and Switching Characteristics of Twin–Striped Lasers With a Reduced Stripe Spacing," S. Mukai et al., Optical and Quantum Electronics 17 (1985), pp. 431–434.

"A New Structure for High–Power TW–SLA," G. Bendelli et al., IEEE Photonics Technology Letters, vol. 3, No. 1, Jan. 1991, pp. 42–44.

"2.0 W CW, Diffraction–Limited Operation of a Monolithically Integrated Master Oscillator Power Amplifier," Ross Parke et al., IEEE Photonics Technology Letters, vol. 5, No. 3, Mar. 1993, pp. 297–300.

Primary Examiner—Mark Hellner
Attorney, Agent, or Firm—Young & Thompson

[57] ABSTRACT

In a semiconductor optical amplifier device comprising a semiconductor laser section and a semiconductor optical amplifier both of which are formed on the same semiconductor substrate and which are coupled to each other, the semiconductor optical amplifier comprises a tapered electrode formed on an upper surface thereof. The tapered electrode is divided into a plurality of divided electrodes by at least one of dividing sections which extends along a propagation direction of an incident laser beam. The plurality of divided electrodes are supplied with injection currents which are variable in each of the plurality of divided electrodes.

4 Claims, 11 Drawing Sheets

SEMICONDUCTOR OPTICAL AMPLIFIER DEVICE CAPABLE OF DEFLECTING OUTPUT LASER BEAM

BACKGROUND OF THE INVENTION

This invention relates to a semiconductor optical amplifier device which is capable of deflecting an output laser beam. Such a semiconductor optical amplifier device is particularly useful for a distance measurement device.

In a field of optical measurement, a measurement system using a high power laser beam is under consideration. As an example, a distance measurement device is provided for measuring a long distance. In such a distance measurement device, it is desirable to deflect a laser beam in order to realize three-dimensional distance measurement. A first method of electrically deflecting the laser beam is disclosed in Japanese Patent Publication No. Tokko Hei 2-39773 (39773/1990). A second method of electrically deflecting the laser beam is disclosed in a paper contributed by S. Mukai et al to the Optical and Quantum Electronics 17, 1985, pages 431 to 434, under the title of "BEAM SCANNING AND SWITCHING CHARACTERISTICS OF TWIN-STRIPED LASERS WITH A REDUCED STRIP SPACING".

According to the first method, an optical control element comprises a semiconductor substrate layer, a plurality of strip electrodes formed, in parallel, onto an upper surface of the semiconductor substrate layer, and a voltage supply unit. The voltage supply unit supplies the voltage to each of the plurality of strip electrodes so as to form a plurality of waveguide paths along each of the plurality of strip electrodes. The voltage supply unit individually controls the voltage to be supplied to each of the plurality of strip electrodes in order to change a refractive index of each of the plurality of waveguide paths. As a result, it is possible to control phase deviations of coherent lights which propagate in each of the plurality of waveguide paths. A plurality of laser beams emitted from the plurality of waveguide paths are superimposed as an output laser beam having a predetermined deflection angle.

According to the second method, a semiconductor laser device comprises a laser resonator formed on a semiconductor substrate layer. The laser resonator is divided into two parts by an etched groove. The semiconductor laser device further comprises a pair of electrodes formed on an upper surface of the device and divided by the etching groove. The pair of electrodes are supplied with injection currents which are individually controlled. Namely, each of the injection currents is controlled to spatially change an injection current density which is supplied to each of the pair of electrodes in order to change a refractive index of the laser resonator. As a result, it is possible to obtain an output laser beam having a predetermined deflection angle.

In the first method, however, it is hard to obtain a high power output laser beam because it leaves a high power output laser beam out of consideration. In the second method also, it is hard to obtain the high power output laser beam because the semiconductor laser device has a narrow light emitting area.

SUMMARY OF THE INVENTION

It is therefore an object of this invention to provide a semiconductor optical amplifier device which is capable of obtaining a high power output laser beam and which is capable of deflecting the high power output laser beam.

Other objects of this invention will become clear as the description proceeds.

According to an aspect of this invention, a semiconductor optical amplifier comprises a waveguide layer formed on a semiconductor substrate and a tapered electrode formed on an upper surface thereof. The semiconductor optical amplifier is supplied with an incident laser beam through an incident surface and amplifies the incident laser beam to emit an amplified laser beam as an output laser beam through an emission surface. The tapered electrode spreads toward the emission surface. The tapered electrode is divided into a plurality of divided electrodes by at least one of dividing sections which extends along a propagation direction of the incident laser beam. The plurality of divided electrodes are supplied with injection currents which are variable in each of the plurality of divided electrodes.

According to another aspect of this invention, a semiconductor optical amplifier device comprises a semiconductor laser section and a semiconductor optical amplifier both of which are formed on the same semiconductor substrate and which are coupled to each other. The semiconductor optical amplifier comprises a waveguide layer formed on the semiconductor substrate and a tapered electrode formed on an upper surface thereof. The semiconductor optical amplifier is supplied with an incident laser beam through an incident surface and amplifies the incident laser beam to emit an amplified laser beam as an output laser beam through an emission surface. The tapered electrode spreads toward the emission surface. The tapered electrode is divided into a plurality of divided electrodes by at least one of dividing sections which extends along a propagation direction of the incident laser beam. The plurality of divided electrodes are supplied with injection currents which are variable in each of the plurality of divided electrodes.

According to a further aspect of this invention, a semiconductor optical amplifier device comprises a semiconductor laser section and a semiconductor optical amplifier both of which are formed on the same semiconductor substrate and which are coupled to each other. The semiconductor optical amplifier comprises a waveguide layer formed on the semiconductor substrate and a tapered electrode formed on an upper surface thereof. The semiconductor optical amplifier is supplied with an incident laser beam from the semiconductor laser section through an incident surface and amplifies the incident laser beam to emit an amplified laser beam as an output laser beam through an emission surface. The tapered electrode spreads toward the emission surface. The semiconductor optical amplifier device further comprises a control section having a wedge shape and formed between the semiconductor laser section and the semiconductor optical amplifier for controlling a refractive index of the waveguide layer positioned between the semiconductor laser section and the semiconductor optical amplifier in response to an injection current or voltage supplied thereto.

According to a still further aspect of this invention, a semiconductor optical amplifier device comprises a semiconductor laser array section and a semiconductor optical amplifier both of which are formed on the same semiconductor substrate and which are coupled to each other. The semiconductor optical amplifier comprises a waveguide layer formed on the semiconductor substrate. The semiconductor optical amplifier is supplied with an incident laser beam from the semiconductor laser array section through an incident surface and amplifies the incident laser beam to emit an amplified laser beam as an output laser beam through an emission surface. The semiconductor laser array section comprises a plurality of semiconductor laser sections arrayed in parallel. One of the incident surface and the emission surface of the semiconductor optical amplifier has a curved surface.

DESCRIPTION OF THE PREFERRED EMBODIMENTS

Figure 1:
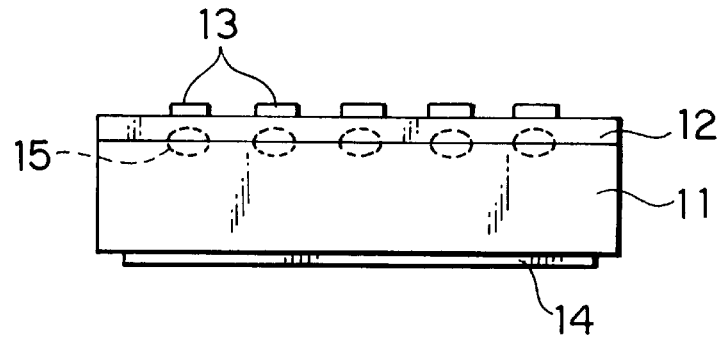
FIG. 1 is a top view of a conventional optical control element.
Figure 2:
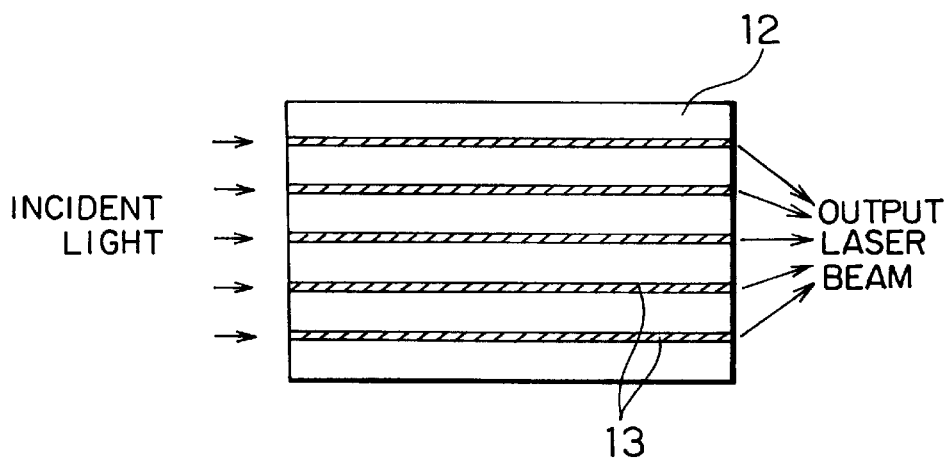
FIG. 2 is a front view of the optical control element illustrated in FIG. 1.

Referring to FIGS. 1 and 2, description will be made at first as regards a conventional optical control element in order to facilitate an understanding of this invention. The optical control element has already been referred to, as a first method, in the Background of the Invention mentioned above. The optical control element is supplied with an incident light through an incident surface and emits or projects an output laser beam through an emission surface. The optical control element comprises an n-type GaAs substrate 11 and a p-type GaAs layer 12 formed on an upper surface of the n-type GaAs substrate 11. A plurality of strip electrodes are formed, in parallel, on an upper surface of the p-type GaAs layer 12, namely, an upper surface of the optical control element. An under electrode 14 is formed on an under surface of the n-type GaAs layer 11, namely, an under surface of the optical control element. Thus, the optical control element has a p-n junction area between the n-type GaAs layer 11 and the p-type GaAs layer 12. As a result, a plurality of waveguide paths are formed along the plurality of strip electrodes 13.

In such a structure, a plurality of depletion layers 15 are formed at the p-n junction area just under the plurality of strip electrodes 13. When an inverse bias voltage is given between the plurality of strip electrodes 13 and the under electrode 14, each of the plurality of depletion layers 15 has an enlarged area. As a result, each of the plurality of depletion layers 15 has an increased refractive index. Under the circumstances, if the inverse bias voltages given to the respective strip electrodes 13 are individually controlled, it is possible to control phase deviations of coherent lights which propagate the plurality of waveguide paths. A plurality of laser beams emitted from the plurality of waveguide paths are superimposed as an output laser beam having a predetermined deflection angle. The optical control element is suitable for an optical amplifier device for emitting a low power output laser beam.

Figure 3:
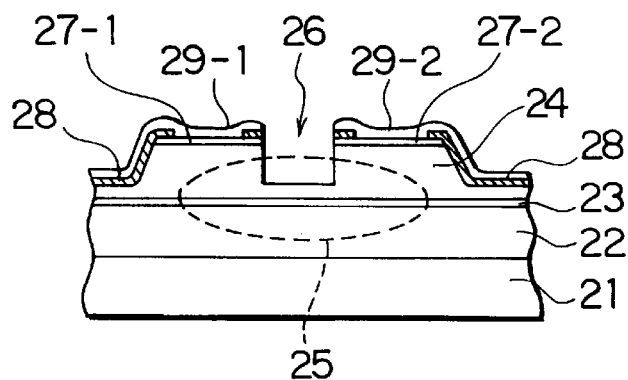
FIG. 3 is a partial cross-sectional view of a conventional semiconductor laser device.
Figure 4:
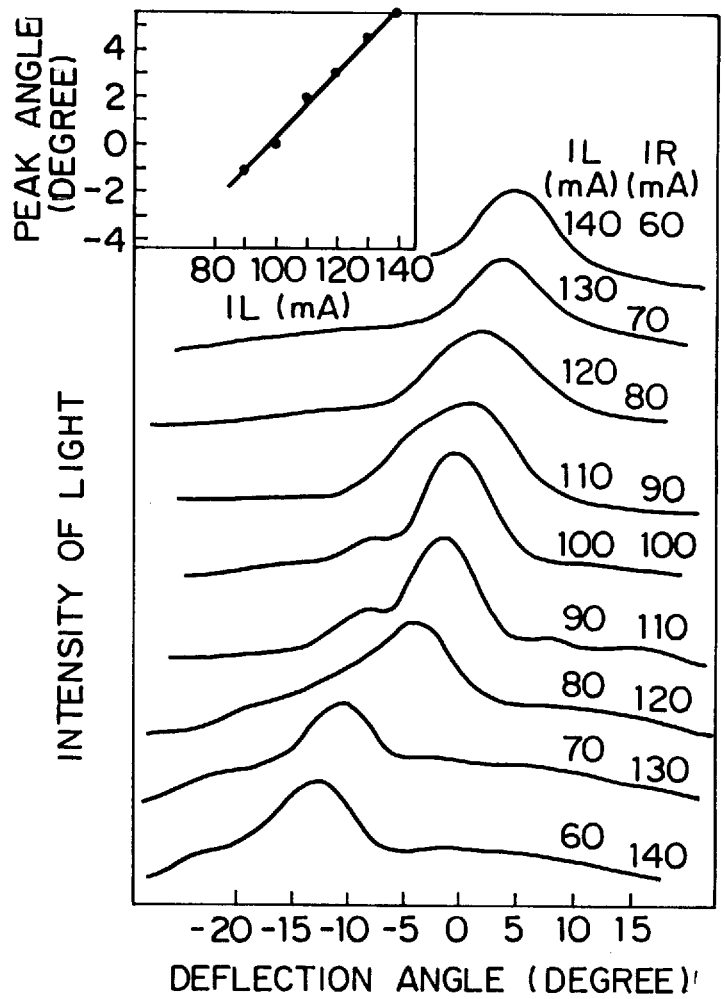
FIG. 4 shows a characteristic of deflection angle versus intensity of light obtained by the semiconductor laser device illustrated in FIG. 3.

Referring to FIGS. 3 and 4, the description will proceed to a conventional semiconductor laser device. Such a semiconductor laser device has already been referred to, as a second method, in the Background of the Invention. The semiconductor laser device comprises an n-type GaAs substrate 21, an n-type GaAlAs layer 22 formed on the n-type GaAs substrate 21, a GaAlAs active layer 23 formed on the n-type GaAlAs layer 22, and a p-type GaAlAs layer 24 formed on the GaAlAs active layer 23. In this structure, a laser resonator 25 is formed at a specific area of the GaAlAs active layer 23. An etched groove 26 is formed onto the p-type GaAlAs layer 24 in order to divide the laser resonator 25 into two parts. As a result, the p-type GaAlAs layer 24 has a pair of mesa portions. Upper surfaces of the pair of mesa portions are covered by first and second Cu or Au layers 27-1 and 27-2. An upper surface of the p-type GaAlAs layer 24 is covered by an insulator layer 28. First and second electrodes 29-1 and 29-2 are formed on the first and the second Cu or Au layers 27-1 and 27-2, respectively.

In this case, first and second injection currents IL and IR are supplied to the pair of mesa portions through the first and the second electrodes 29-1 and 29-2, respectively. If the first and the second injection currents IL and IR are individually controlled, current density of each of the pair of mesa portions is spatially changed. This causes change of the refractive index of each of the pair of mesa portions. As a result, the semiconductor laser device emits the output laser beam having a preselected deflection angle.

In FIG. 4, the first and the second injection currents IL and IR are varied so that a total current is fixed to 200 (mA). Each combination of the first and the second injection currents IL and IR has one main peak. Particularly, in an angle range of −1 degree to 6 degrees, the main peak shifts very smoothly and almost linearly with the injection currents. Thus, the semiconductor laser device has a total deflection angle of 7 degrees. However, the semiconductor laser device is not suitable for emitting a high power output laser beam. This is because the semiconductor laser device has a narrow laser resonator area, namely, a narrow light emitting area.

Figure 5:
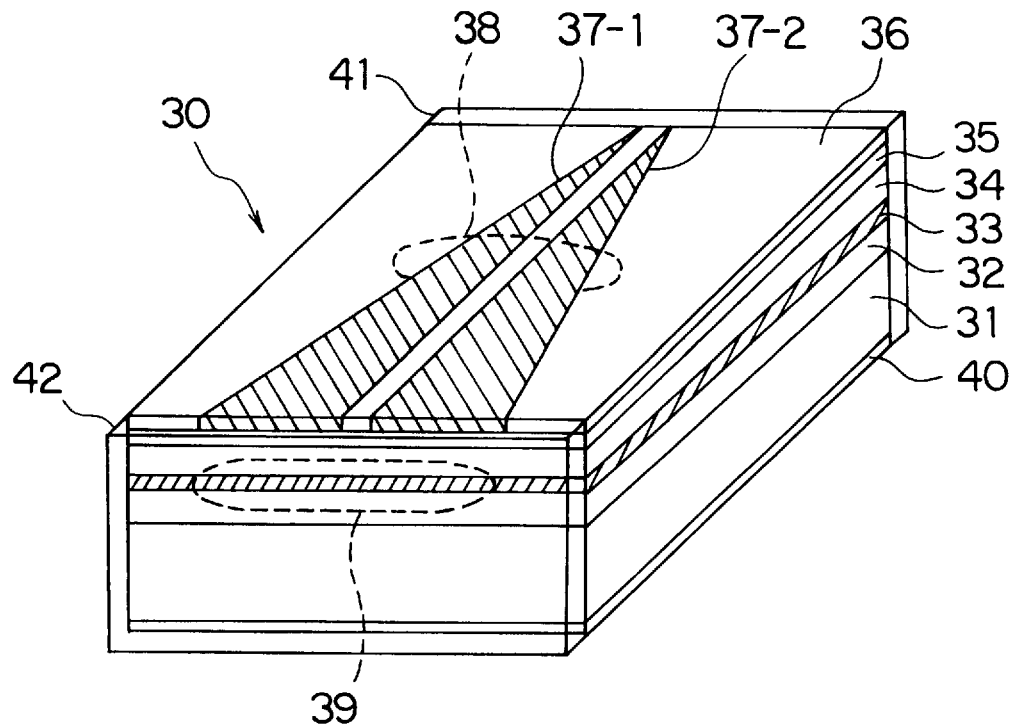
FIG. 5 is a perspective view of a semiconductor optical amplifier according to a first embodiment of this invention.
Figure 6:
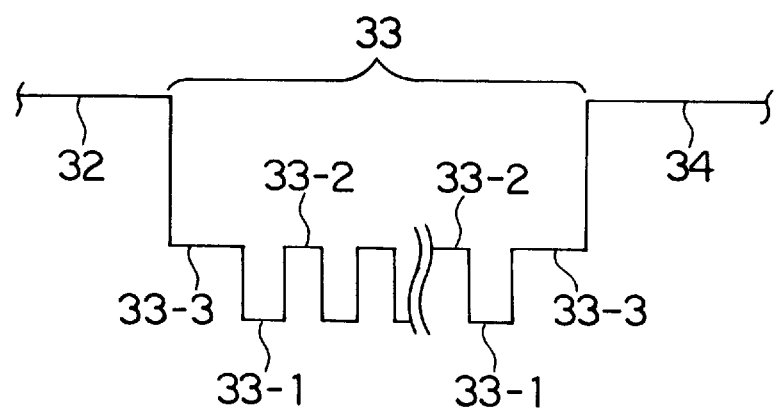
FIG. 6 is an illustration for describing a layer structure of an active layer illustrated in FIG. 5.

Referring to FIGS. 5 and 6, the description will be made as regards a semiconductor optical amplifier 30 according to a first embodiment of this invention. The semiconductor optical amplifier 30 is an improvement of a conventional high power semiconductor optical amplifier which is called a travelling wave semiconductor laser amplifier (TW-SLA) and which is disclosed in a paper contributed by G. Bendelli et al to the IEEE PHOTONICS TECHNOLOGY LETTERS, Vol. 3, No. 1, January 1991, pages 42 to 44, under the title of "A New Structure for High-Power TW-SLA". The semiconductor optical amplifier 30 is suitable for the laser beam having a wavelength of 1.5 $\mu$m.

In FIG. 5, the description will be made as regards the structure of the semiconductor optical amplifier 30 in accordance with the order of the fabrication step. The semiconductor optical amplifier 30 comprises an n-type InP substrate 31, an n-type InP clad layer 32 formed onto the n-type InP substrate 31, an active layer 33 formed onto the n-type InP clad layer 32, a p-type InP clad layer 34 formed onto the active layer 33, and a p-type $Ga_{0.47}In_{0.53}As$ contact layer 35. Each of the layers is made by an epitaxial growth method known in the art. The clad layers 32 and 34 and the contact layer 35 have the thickness of 0.5 $\mu$m, 1.5 $\mu$m, and 0.2 $\mu$m, respectively.

As shown in FIG. 2, the active layer 33 has a multiple quantum well structure which comprises a $Ga_{0.47}In_{0.53}As$ quantum well layer 33-1, a p-type $Ga_{0.22}In_{0.78}As_{0.48}P_{0.52}$ barrier layer 33-2, and a $Ga_{0.22}In_{0.78}As_{0.48}P_{0.52}$ SCH (Separate Confinement Heterostructure) layer 33-3. The quantum well layer 33-1, the barrier layer 33-2, and the SCH layer 33-3 have the thickness of 3.7 nm, 8 nm, and 50 nm, respectively. The epitaxial growth is carried out by an organometal vapor phase epitaxy method or a chemical beam growth method.

A dielectric layer 36 is formed of SiON onto the p-type contact layer 35. The dielectric layer 36 is etched by an etching method in order to form a pair of tapered windows. A pair of p-side electrodes 37-1 and 37-2 are formed into the pair of tapered windows. In other words, the pair of p-side electrodes 37-1 and 37-2 are separated from each other by the dielectric layer 36. The dielectric layer 36 positioned between the pair of p-side electrodes 37-1 and 37-2 serves as a dividing section. The pair of p-side electrodes 37-1 and 37-2 have a tapered shape and will be called first and second divided electrodes. Thus, a waveguide layer is formed on the n-type InP substrate 31. The waveguide layer is defined by the first and the second divided electrodes 37-1 and 37-2. Namely, the waveguide layer is present under the first and the second divided electrodes 37-1 and 37-2. The semiconductor optical amplifier 30 has an optical amplifier region 38 under the first and the second divided electrodes 37-1 and 37-2.

In this case, the semiconductor optical amplifier 30 has an incident surface that is supplied with an incident laser beam from a semiconductor laser device (not shown) and that is one end surface positioned at one side in which the first and the second divided electrodes 37-1 and 37-2 have a most narrowest width. In particular, a laser beam incident region is defined within the incident surface by the first and the second divided electrodes 37-1 and 37-2 which have the most narrowest width. The semiconductor optical amplifier 30 has an emission surface for emitting an output laser beam. The emission surface is another end surface positioned at another side in which the first and the second divided electrodes 37-1 and 37-2 have a most widest width. Particularly, an output laser beam emission region 39 is defined within the emission surface as shown by dotted line. Next, the n-type InP substrate 31 is abraded by the thickness of about 100 $\mu$m. An n-side electrode 40 is formed onto an under surface of the n-type InP substrate 31. Reflection films having low reflectivity 41 and 42 are formed onto the incident surface and the emission surface, respectively. At last, the semiconductor optical amplifier 30 is cut out as a single chip.

In the example, the optical amplifier region 38 has the length of 1000 $\mu$m. The laser beam incident region has the width of 2 $\mu$m while the output laser beam emission region 39 has the width of 140 $\mu$m. The first and the second divided electrodes 37-1 and 37-2 are separated by the dielectric layer 36 at an interval of 2 $\mu$m.

As will later be described in detail, first and second injection currents I1 and I2 are supplied to the first and the second divided electrodes 37-1 and 37-2, respectively. If the first injection current I1 is changed, injection current density spatially changes in the waveguide layer that is present under the first divided electrode 37-1. This means that refractive index of the waveguide layer spatially changes. This applies to the second divided electrode 37-2. Thus, the change of the refractive index of the waveguide layer causes deflection of the output laser beam.

Figure 7:
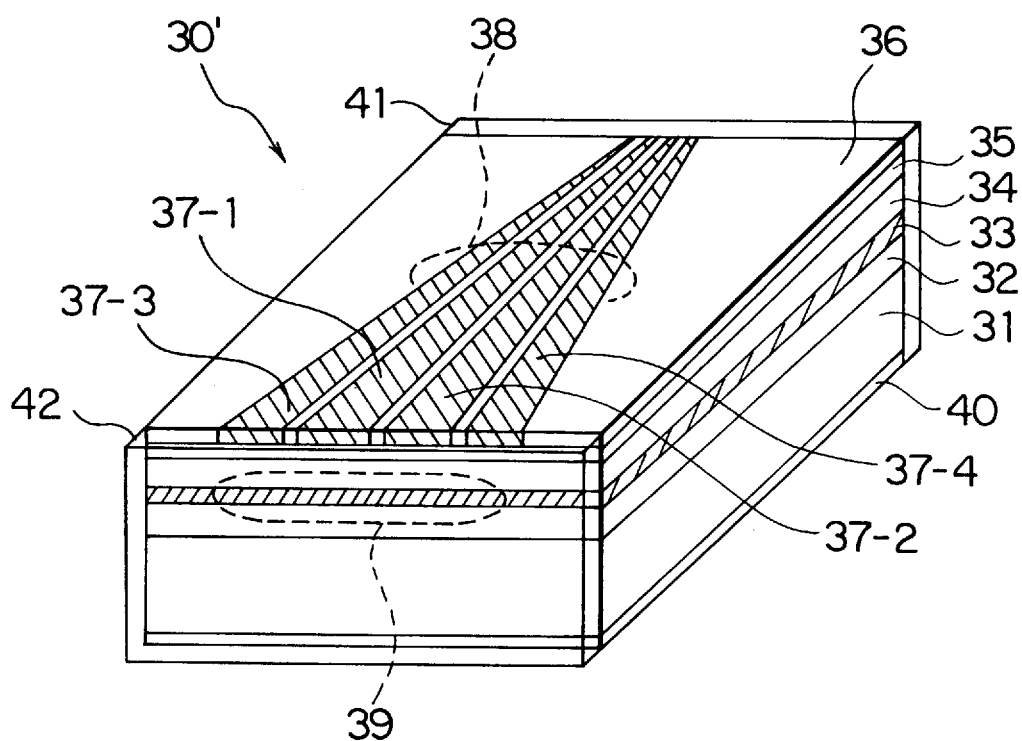
FIG. 7 is a perspective view of a modification of the semiconductor optical amplifier device illustrated in FIG. 5.

Referring to FIG. 7, the description will proceed to a modification of the semiconductor optical amplifier 30 illustrated in FIG. 5. A semiconductor optical amplifier 30' is similar to that illustrated in FIG. 5 except that the number of the divided electrodes is equal to four. Namely, first through fourth divided electrodes are depicted at 37-1 to 37-4. The semiconductor optical amplifier 30' has the same effect as the case illustrated in FIG. 5. The optical amplifier region 38 has the length of 1000 $\mu$m. The laser beam incident region has the width of 2 $\mu$m while the output laser beam emission region 39 has the width of 140 $\mu$m.

Figure 8:
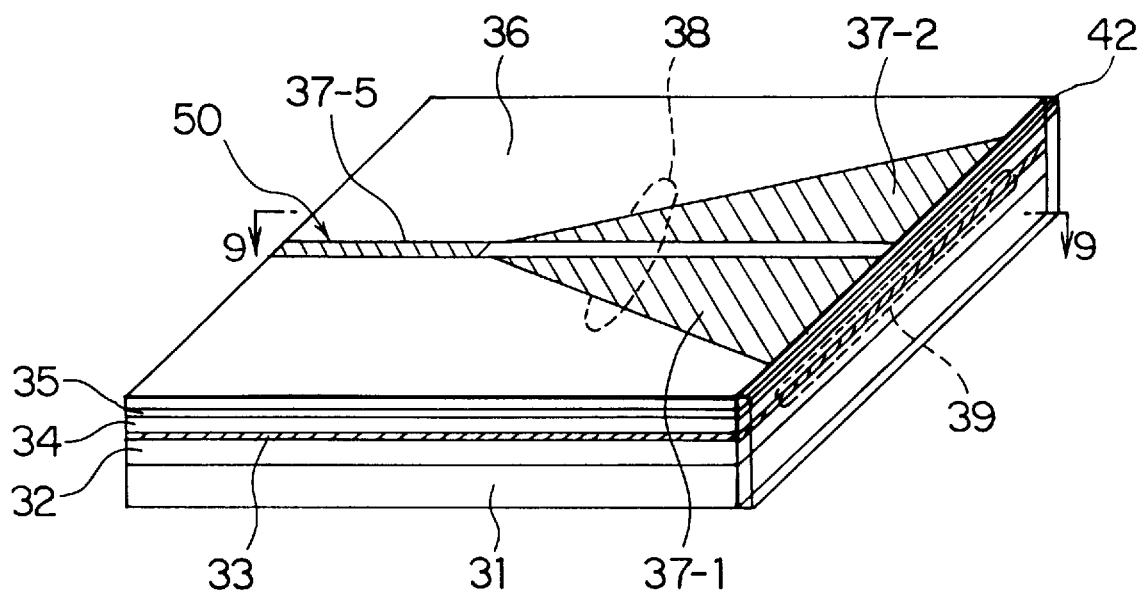
FIG. 8 is a perspective view of a semiconductor optical amplifier device according to a second embodiment of this invention.
Figure 9:
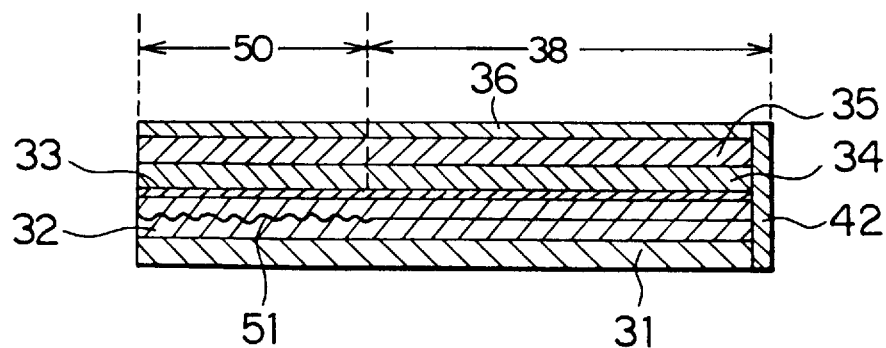
FIG. 9 is a cross-sectional view taken on line 9—9 in FIG. 8.

Referring to FIGS. 8 and 9, a semiconductor optical amplifier device according to a second embodiment of this invention is an improvement of a conventional high power semiconductor optical amplifier which is called a monolithically integrated master oscillator power amplifier (MOPA). Such a monolithically integrated master oscillator power amplifier is disclosed in a paper contributed by Ross Parke et al to the IEEE PHOTONICS TECHNOLOGY LETTERS, VOL. 5, NO. 3, March 1993, pages 297 to 300, under the title of "2.0 W CW, Diffraction-Limited Operation of a Monolithically Integrated Master Oscillator Power Amplifier".

The semiconductor optical amplifier device comprises the same layer structure as the case illustrated in FIG. 5 except that a master laser section 50 is formed on the n-type InP substrate 31. Namely, the semiconductor optical amplifier illustrated in FIG. 5 is combined with the master laser section 50 by the use of the n-type InP substrate 31. The master laser section 50 has a Distributed Feedback (DFB) structure or a Distributed Bragg Reflector (DBR) structure. The master laser section 50 comprises a diffraction grating 51 formed into the n-type InP clad layer 32. In the example, the diffraction grating 51 is formed at first. Then, the layer structure is formed by the same fabrication steps mentioned before. The dielectric layer 36 is etched in order to form etched areas, as windows, into the current injection regions of the optical amplifier region 38 and the master laser section 50. A p-side electrode 37-5 is formed into the window that is formed in the master laser section 50. The first and the second divided electrodes 37-1 and 37-2 are formed into the pair of windows that are formed in the optical amplifier region 38. It should be noted here that the p-side electrode 37-5 is separated from the first and the second divided electrodes 37-1 and 37-2.

The master laser section 50 generates a laser beam having a predetermined wavelength. The optical amplifier region 38 is supplied with the laser beam as the incident laser beam from the master laser section 50 through the laser beam incident region formed between the master laser section 50 and the optical amplifier region 38. In this case, the optical amplifier region 38 has the length of 1000 μm. The laser beam incident region has the width of 2 μm while the output laser beam emission region 39 has the width of 140 μm. The first and the second divided electrodes 37-1 and 37-2 are separated by the dielectric layer 36 at the interval of 2 μm. The p-side electrode 37-5 has the width of 2 μm and the length of 500 μm.

Figure 10:
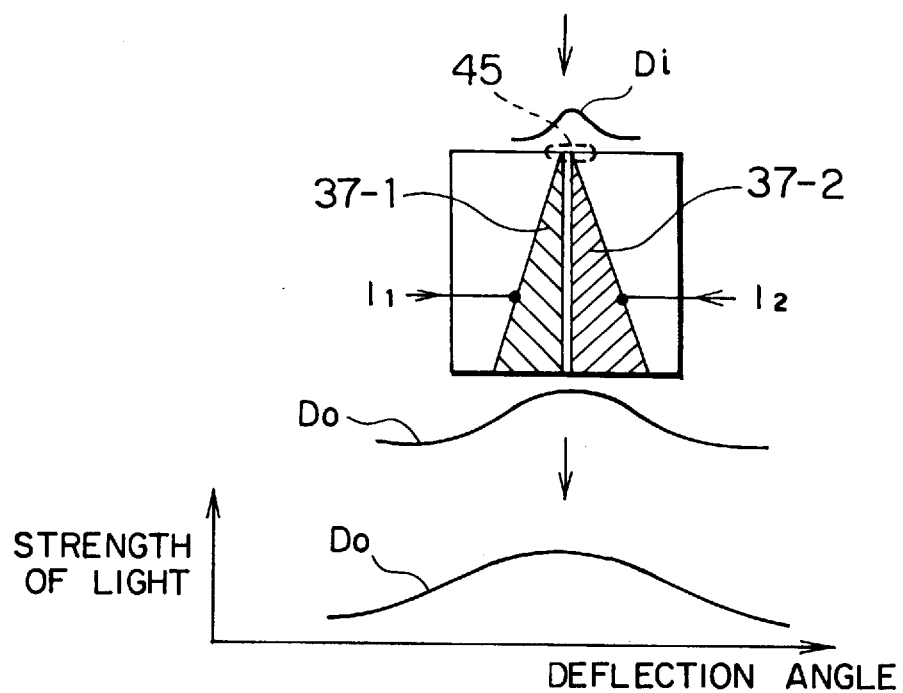
FIG. 10 is an illustration for describing driving method and deflection operation of the semiconductor optical amplifier device illustrated in FIG. 5.
Figure 11:
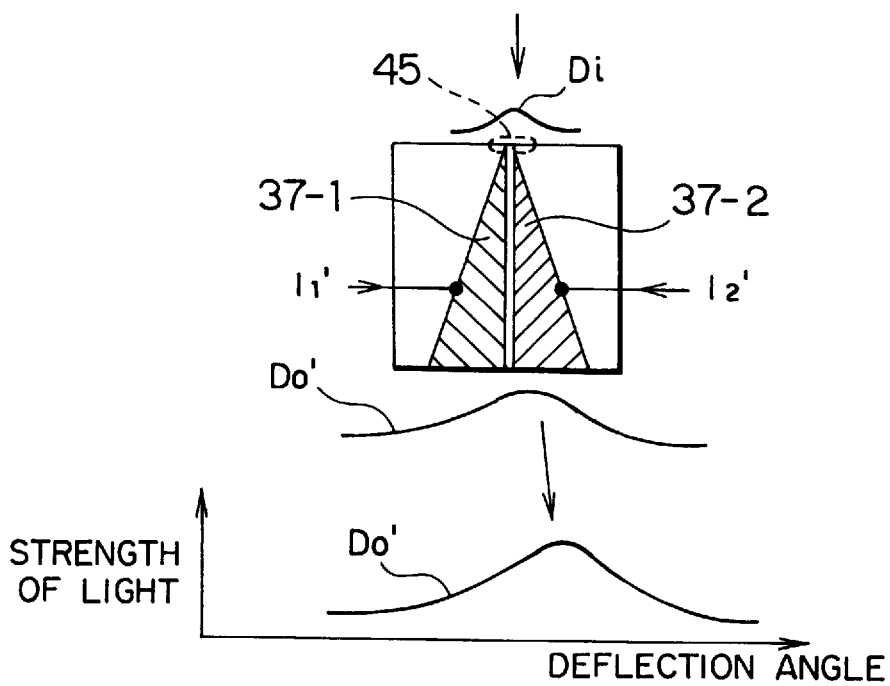
FIG. 11 is an illustration for describing driving method and deflection operation of the semiconductor optical amplifier device illustrated in FIG. 5.

Referring to FIGS. 10 and 11, the description will be made as regards driving method and deflection operation of the semiconductor optical amplifier 30 mentioned above. The driving method and the deflection operation can be applied to the semiconductor optical amplifier 30' illustrated in FIG. 7 and the semiconductor optical amplifier device illustrated in FIG. 8.

The first and the second divided electrodes 37-1 and 37-2 are supplied with the first and the second injection currents I1 and I2, respectively. When the first injection current I1 is changed, the injection current density spatially changes in the waveguide layer that is present under the first divided electrode 37-1. The change of the injection current density causes spatial change of the refractive index of the waveguide layer. This applies to the second divided electrode 37-2. This means that it is possible to control a distribution of the refractive index in transverse direction of the semiconductor optical amplifier by adjusting the first and the second injection currents I1 and I2.

In FIG. 10, the laser beam incident region is depicted at 45. The first injection current I1 has a current value which is equal to that of the second injection current I2. In this case, when the semiconductor optical amplifier is supplied with the incident laser beam having a light strength distribution Di through the laser beam incident region 45, the output laser beam has a light strength distribution Do of a symmetrical shape. As a result, the emission direction of the output laser beam becomes parallel with the incident direction of the incident laser beam.

In FIG. 11, the first injection current I1' has a current value which is higher than that of the second injection current I2. In this case, when the semiconductor optical amplifier is supplied with the incident laser beam having the light strength distribution D1, a light strength distribution Do' of the output laser beam deflects to the side of the second divided electrode 37-2 that is small in injection current density. This is because the waveguide layer under the second divided electrode 37-2 has a reduced refractive index. As a result, the emission direction of the output laser beam deflects to the side of the second divided electrode 37-2. Thus, the change of the refractive index of the waveguide layer causes deflection of the output laser beam. In the example, it is possible to obtain the output power of 2 (W) and the deflection angle of 5 degrees by supply of the incident laser beam of 1 (mW) through the laser beam incident region 45 and by supply of the first injection current of 7 (A) and the second injection current of 3 (A).

In particular, the semiconductor optical amplifier device illustrated in FIG. 8 can emit a high power output laser beam because the optical amplifier region 38 is directly supplied with the incident laser beam generated by the master laser section 50.

Figure 12:
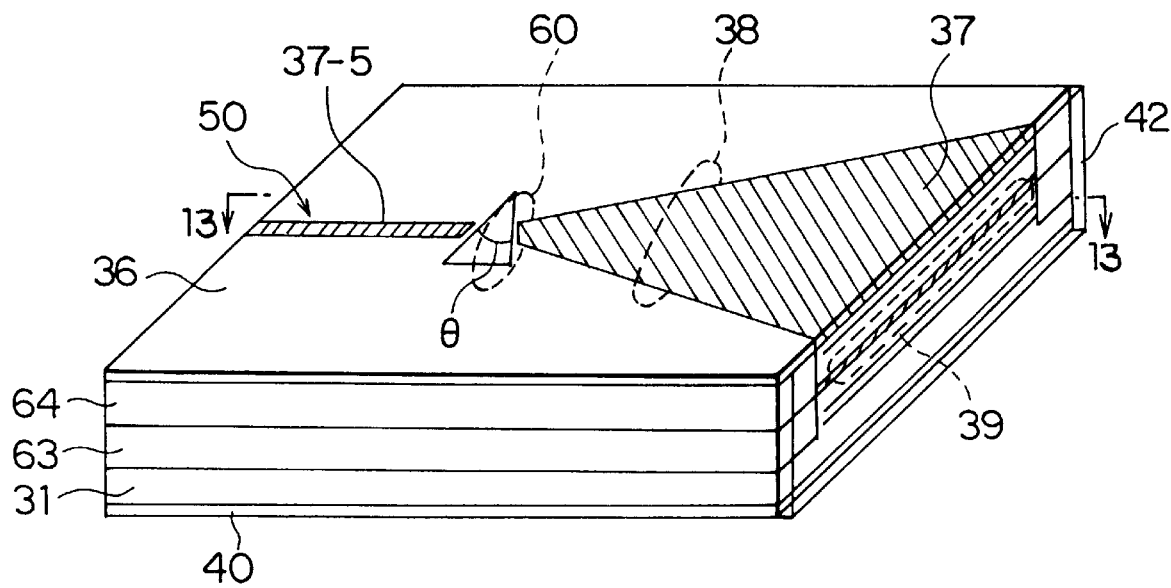
FIG. 12 is a perspective view of a semiconductor optical amplifier device according to a third embodiment of this invention.
Figure 13:
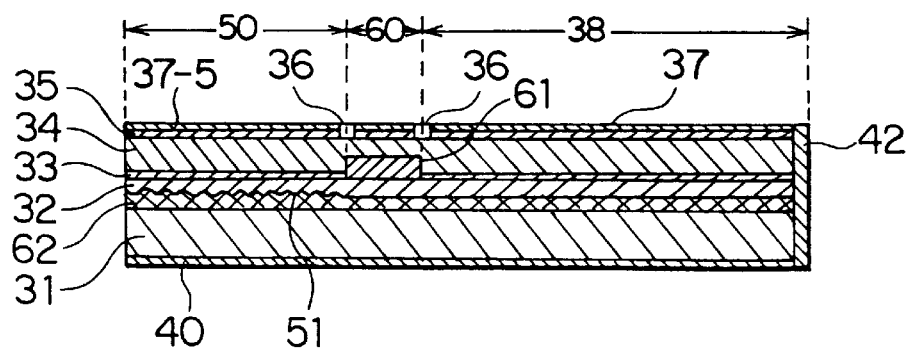
FIG. 13 is a cross-sectional view taken on line 13—13 in FIG. 12.

Referring to FIGS. 12 and 13, the description will proceed to a semiconductor optical amplifier device according to a third embodiment of this invention. The semiconductor optical amplifier device comprises the optical amplifier region 38, the master laser section 50, and a beam control section 60 formed between the optical amplifier region 38 and the master laser section 50. The beam control section 60 has a wedge shape and comprises a refractive index variable layer 61 having the wedge shape. It should be noted here that the optical amplifier region 38 comprises a single p-side electrode 37 having a tapered shape. The p-side electrodes 37 and 37-5 are separated by the beam control section 60.

In FIG. 13, the n-type InP clad layer 32 is formed onto the n-type InP substrate 31. The diffraction grating 51 is formed in the master laser section 50. A waveguide layer 62, the quantum well active layer 33, and the p-type InP clad layer 34 are formed, in order, as mentioned in conjunction with FIG. 5. The active layer 33 comprises the GaInAs quantum well layer and the GaInAsP barrier layer. The thickness of each of the layers is equal to that described in conjunction with FIG. 5. The waveguide layer 62 has the thickness of 0.1 μm. Then, the p-type InP clad layer 34 and the active layer 33 are etched in the shape of a wedge at the beam control section 60. The refractive index variable layer 61 is formed, as a buried layer, into the etched area. The refractive index variable layer 61 has the multiple quantum well structure and comprises a plurality of GaInAsP layers and a plurality of InP layers. Namely, the refractive index variable layer 61 is formed by alternately forming the GaInAsP layer and the InP layer. In the example, the number of each of the GaInAsP layer and the InP layer is equal to 20. Each of the GaInAsP layer and the InP layer has the thickness of 10 nm. Then, the p$^+$-type InGaAs contact layer 35 is formed onto an upper surface. After this, etching process is carried out except the master laser section 50, the beam control section 60, and the optical amplifier region 38 until the waveguide layer 62 exposes.

Then, a p-type InP layer 63 and an n-type InP layer 64 are formed again onto the exposed waveguide layer 62. Further, the dielectric layer 36 is formed onto the n-type InP layer 64. As a result, the windows are formed into the regions corresponding to the master laser section 50, the beam control section 60, and the optical amplifier region 38. The p-side electrodes 37 and 37-5 are formed into the windows. The p-side electrode 37 has a tapered shape while the p-side electrode 37-5 has a strip shape. Next, the n-type InP substrate 31 is abraded by the thickness of about 100 μm. The n-side electrode 40 is formed onto the under surface of the n-type InP substrate 31. The reflection film 42 is formed onto the emission surface. At last, the semiconductor optical amplifier device is cut out as a single chip.

In the example, the master laser section 50 has the width of 2 μm and the length of 500 μm. The optical amplifier region 38 has the length of 1000 μm. The output laser beam emission region 39 has the width of 140 μm. The beam control section 60 has the width of 10 μm. An angle θ of the wedge is equal to 30 degrees.

Figure 14:
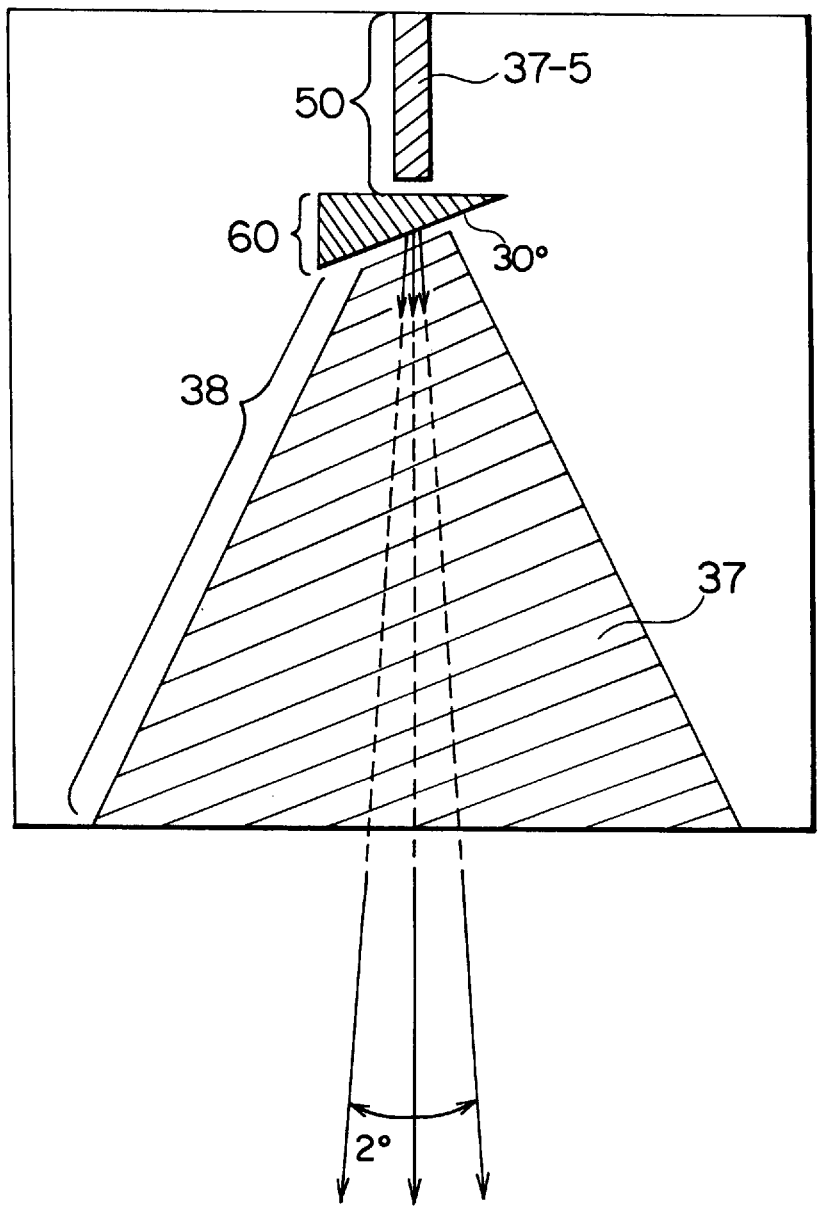
FIG. 14 is an illustration for describing driving method and deflection operation of the semiconductor optical amplifier device illustrated in FIG. 12.

Referring to FIG. 14, the description will be made as regards the driving method and the deflection operation of the semiconductor amplifier device illustrated in FIG. 12. When the current is supplied to the master laser section 50 through the p-side electrodes 37-5, it generates the laser beam. The laser beam is supplied to the optical amplifier region 38 as the incident laser beam. The optical amplifier region 38 is supplied with the current through the p-side electrode 37 and emits an amplified laser beam as the output laser beam. In this event, an emission direction of the output laser beam is adjusted by control of the voltage to be supplied to the beam control section 60. This is based on a Quantum-Confined Stark Effect of the multiple quantum well structure in the refractive index variable layer 61. The Quantum-Confined Stark Effect is disclosed in a paper contributed by D. A. B. Miller et al to the PHYSICAL REVIEW LETTERS, VOL. 53, NO. 22, Nov. 26, 1984, under the title of "Band-Edge Electroabsorption in Quantum Well Structure: The Quantum-Confined Stark Effect".

In the example, when the voltage supplied to the beam control section 60 is changed from 0 (V) to 4 (V), the refractive index of the refractive index variable layer 61 is changed from 3.5 to 3.6. In this case, the output laser beam has an overall deflection angle of 2 degrees. Moreover, when the master laser section 50 and the optical amplifier region 38 are driven by the currents of 20 (mA) and 10 (A), respectively, it is possible to obtain the high power output laser beam of 5 (W) at most.

Figure 15:
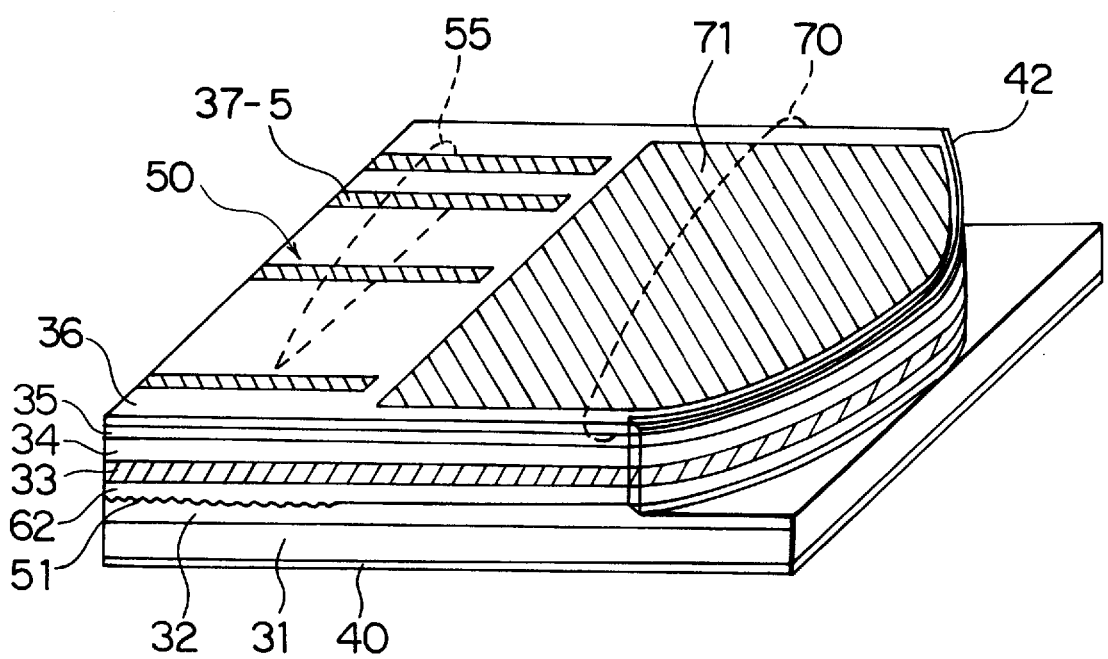
FIG. 15 is a perspective view of a semiconductor optical amplifier device according to a fourth embodiment of this invention.
Figure 16:
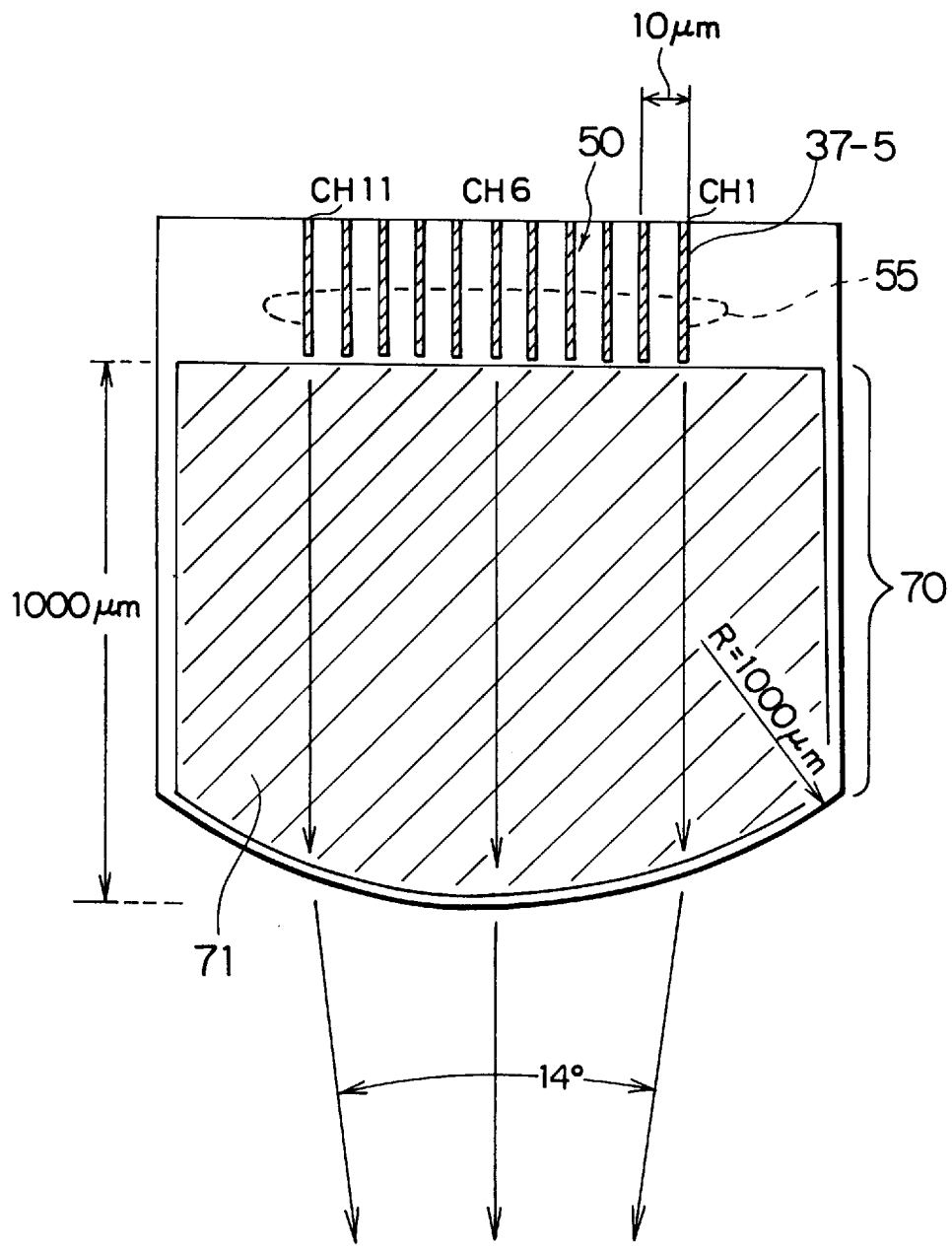
FIG. 16 is an illustration for describing driving method and deflection operation of the semiconductor optical amplifier device illustrated in FIG. 15.

Referring to FIGS. 15 and 16, the description will proceed to a semiconductor optical amplifier device according to a fourth embodiment of this invention. The semiconductor optical amplifier device comprises a plurality of master laser sections 50 and an optical amplifier region 70 which has a lens shape and which is coupled to the plurality of master laser sections 50. Namely, the plurality of master laser sections 50 are formed onto the n-type InP substrate 31 together with the optical amplifier region 70 and are arranged in parallel. Each of the master laser sections 50 is the DFB type which is suitable for the wavelength band of 1.5 μm and has the same layer structure as that described in conjunction with FIG. 13. The plurality of master laser sections 50 may collectively be called a master laser array section 55. The optical amplifier region 70 has a convex surface as the emission surface. A single p-side electrode 71 is formed onto an upper surface of the optical amplifier region 70.

With regard to the fabrication steps, the n-type InP clad layer 32 is formed onto the n-type InP substrate 31. Next, a plurality of diffraction gratings 51 are formed. The n-type GaInAsP waveguide layer 62, the quantum well active layer 33, the p-type InP clad layer 34, and the p-type InGaAs layer 35 are formed, in order. The thickness of each of the layers is equal to that described in conjunction with FIG. 13. The convex surface of the optical amplifier region 70 is formed by the etching method. As shown in FIG. 15, the etching is carried out until an etching depth reaches to a middle portion, in depth, of the n-type clad layer 32.

Subsequently, the dielectric layer 36 is formed onto the p-type contact layer 35. A plurality of windows are formed by the etching onto the dielectric layer 36 in order to form the p-side electrodes 71 and 37-5. The p-side electrodes 71 and 37-5 are formed onto the p-type contact layer 35 through the respective windows. Each of the p-side electrodes 37-5 and the p-side electrode 71 is separated by the dielectric layer 36.

Next, the n-type InP substrate 31 is abraded by the thickness of about 100 μm. The n-side electrode 40 is formed onto the under surface of the n-type InP substrate 31. The reflection film 42 is formed onto the emission surface. At last, the semiconductor optical amplifier device is cut out as a single chip.

In FIG. 16, the number of the master laser sections is equal to 11 and are numbered from CH(channel)1 to CH11. Each of the p-side electrodes 37-5 has the width of 2 μm and is formed at an interval of 10 μm. The optical amplifier region 70 has the length of 1000 μm. The emission surface has a radius of curvature R of 1000 μm. The optical amplifier region 70 is supplied with the current through the p-side electrode 71. The emission direction of the output laser beam is adjusted by switching the master laser section 50 to be supplied with the current. In other words, the current is selectively supplied to one of the plurality of master laser sections in accordance with a required deflection angle. In the example, the overall deflection angle is equal to 14 degrees between the case that the master laser section CH1 is supplied with the current and the case that the master laser section CH11 is supplied with the current. Furthermore, when the master laser section and the optical amplifier region 70 are driven by the currents of 20 (mA) and 20 (A), respectively, it is possible to obtain the high power output laser beam of 5 (W) at most.

Figure 17:
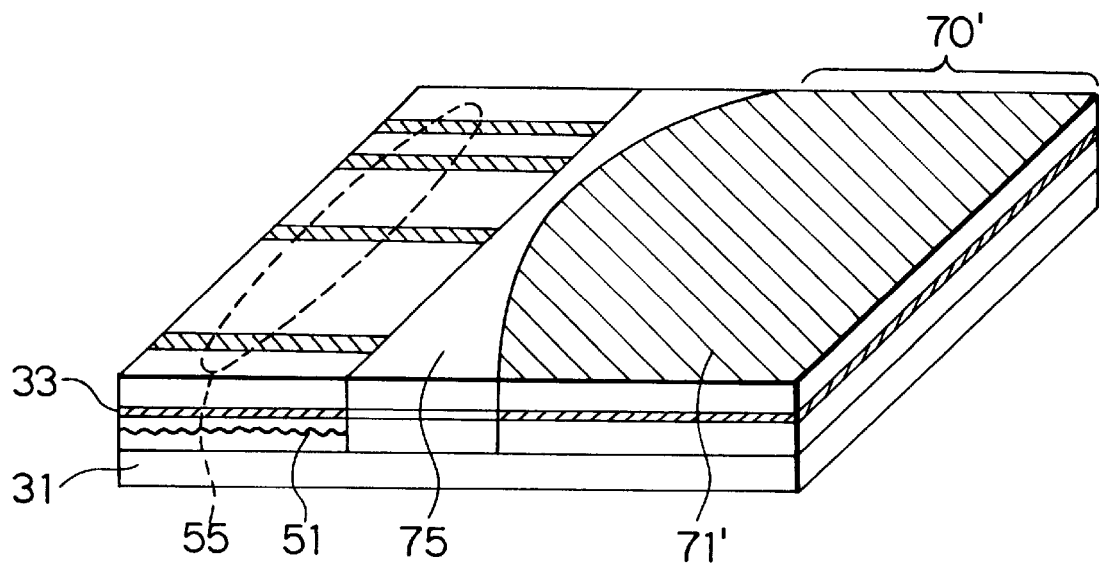
FIG. 17 is a perspective view of a modification of the semiconductor optical amplifier device illustrated in FIG. 15.

Referring to FIG. 17, the description will be made as regards a modification of the semiconductor optical amplifier device illustrated in FIG. 15. Although not illustrated in detail, the semiconductor amplifier device has the same layer structure as that illustrated in FIG. 15. The semiconductor amplifier device comprises the master laser array section 55 which is similar to that illustrated in FIG. 5. In the example, an optical amplifier region 70' is coupled to the master laser array section 55 through a waveguide region 75. In particular, the optical amplifier region 70' is characterized by the incident surface having a convex surface. In this event, the optical amplifier region 70' has an equivalent refractive index higher than that of the waveguide region 75. The driving method and the deflection operation are similar to that illustrated in FIG. 15.

Figure 18:
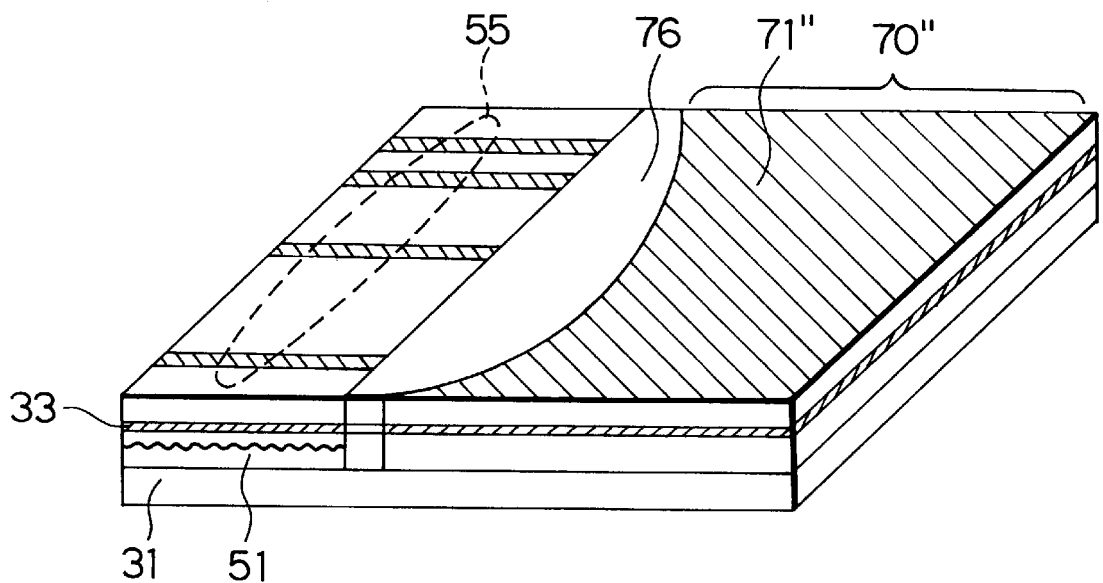
FIG. 18 is a perspective view of another modification of the semiconductor optical amplifier device illustrated in FIG. 15.

Referring to FIG. 18, the description will proceed to another modification of the semiconductor amplifier device illustrated in FIG. 15. The semiconductor amplifier device is similar to that illustrated in FIG. 17 except that an optical amplifier region 70" is characterized by the incident surface having a concave surface. The optical amplifier region 70" is coupled to the master laser array section 55 through a waveguide region 76. In this case, the optical amplifier region 70" has an equivalent refractive index lower than that of the waveguide region 76. The driving method and the deflection operation are similar to that illustrated in FIG. 15.

While this invention has thus far been described in conjunction with a few embodiments thereof, it will readily be possible for those skilled in the art to put this invention into practice in various other manners.

What is claimed is:

1. A semiconductor optical amplifier device comprising a semiconductor laser section and a semiconductor optical amplifier both of which are formed on the same semiconductor substrate and which are coupled to each other, said semiconductor optical amplifier comprising a waveguide layer formed on said semiconductor substrate and a tapered electrode formed on an upper surface thereof, said semiconductor optical amplifier being supplied with an incident laser beam from said semiconductor laser section through an incident surface and amplifying said incident laser beam to emit an amplified laser beam as an output laser beam through an emission surface, said tapered electrode spreading toward said emission surface, wherein said semiconductor optical amplifier device further comprises:

a control section having a wedge shape and formed between said semiconductor laser section and said semiconductor optical amplifier, said control section controlling a refractive index variable layer between said semiconductor laser section and said semiconductor optical amplifier in response to an injection current or voltage supplied thereto.

2. A semiconductor optical amplifier device comprising a semiconductor laser array section and a semiconductor optical amplifier both of which are formed on the same semiconductor substrate and which are coupled to each other, said semiconductor optical amplifier comprising a waveguide layer formed on said semiconductor substrate, said semiconductor optical amplifier being supplied with an incident laser beam from said semiconductor laser array section through an incident surface and amplifying said incident laser beam to emit an amplified laser beam as an output laser beam through an emission surface, wherein:

said semiconductor laser array section comprising a plurality of semiconductor laser sections arrayed in parallel, whereby a deflection angle of said output laser beam is adjusted by supplying current to one of said plurality of semiconductor laser sections;

one of said incident surface and said emission surface of said semiconductor optical amplifier having a curved surface.

3. A semiconductor laser device as claimed in claim 2, wherein said emission surface is a convex surface.

4. A semiconductor laser device as claimed in claim 2, wherein:

said semiconductor laser array section and said semiconductor optical amplifier are coupled through a waveguide section, said incident surface being one of convex and concave surfaces.

* * * * *